(12) United States Patent
Franklin et al.

(10) Patent No.: US 7,946,299 B2
(45) Date of Patent: May 24, 2011

(54) SPRAY JET CLEANING APPARATUS AND METHOD

(75) Inventors: Cole Franklin, San Clemente, CA (US); Mark Rouillard, Mission Viejo, CA (US); Yan Fan, San Diego, CA (US)

(73) Assignee: Akrion Systems, LLC

( * ) Notice: Subject to any disclaimer, the term of this patent is extended or adjusted under 35 U.S.C. 154(b) by 283 days.

(21) Appl. No.: 11/745,866

(22) Filed: May 8, 2007

(65) Prior Publication Data

US 2007/0261716 A1 Nov. 15, 2007

Related U.S. Application Data

(60) Provisional application No. 60/798,831, filed on May 8, 2006, provisional application No. 60/808,821, filed on May 26, 2006, provisional application No. 60/913,860, filed on Apr. 25, 2007.

(51) Int. Cl.
*B08B 3/04* (2006.01)

(52) U.S. Cl. .................................................. 134/102.1

(58) Field of Classification Search ................ 134/102.1
See application file for complete search history.

(56) References Cited

U.S. PATENT DOCUMENTS

| 3,459,374 | A | * | 8/1969 | Probst ............................ 239/707 |
| 5,509,849 | A | * | 4/1996 | Spears, Jr. ........................ 451/40 |
| 5,989,355 | A | | 11/1999 | Brandt et al. |
| 2002/0035762 | A1 | * | 3/2002 | Okuda et al. ...................... 15/77 |
| 2002/0059947 | A1 | | 5/2002 | Sato et al. |

* cited by examiner

*Primary Examiner* — Michael Barr
*Assistant Examiner* — Samuel A Waldbaum
(74) *Attorney, Agent, or Firm* — The Belles Group, P.C.

(57) ABSTRACT

A spray cleaning device having an atomizing unit with at least one gas passage and at least one cleaning fluid passage converging into an atomizing area. The gas flowing though the gas passage and the cleaning fluid flowing through the cleaning fluid passages combine to form a mixture at the atomizing area. The accelerating unit has an acceleration passage for spraying the mixture onto a substrate surface. The gas passages are preferably angled with respect to the cleaning acceleration passage.

22 Claims, 9 Drawing Sheets

SPRAY JET CLEANING APPARATUS AND METHOD

This application claims the benefit of U.S. Provisional Application No. 60/798,831 filed on May 8, 2006, U.S. Provisional Application No. 60/808,821 filed May 26, 2006, and U.S. Provisional Application No. 60/913,860 filed Apr. 25, 2007, the entireties of which are hereby incorporated by reference.

FIELD OF INVENTION

The present invention relates generally to the methods, apparatus, and systems for substrate processing, and specifically to methods, apparatus, and systems for cleaning semiconductor wafers using spray jet cleaning.

BACKGROUND OF THE INVENTION

In the manufacture of semiconductors, semiconductor devices are produced on thin disk-like substrates called wafers. Generally, each substrate contains a plurality of semiconductor devices. The importance of minimizing contaminants on the surface of these substrates during production has been recognized since the beginning of the industry. Moreover, as semiconductor devices become more miniaturized and complex due to end product needs, the cleanliness requirements have become more stringent. This occurs for two reasons.

First, as devices become miniaturized, a contaminating particle on a wafer will occupy a greater percentage of the device's surface area. This increases the likelihood that the device will fail. As such, in order to maintain acceptable output levels of properly functioning devices per wafer, increased cleanliness requirements must be implemented and achieved.

Second, as devices become more complex, the raw materials, time, equipment, and processing steps necessary to make these devices also become more complex and more expensive. As a result, the cost required to make each substrate increases. In order to maintain acceptable levels of profitability, it is imperative to manufacturers that the number of properly functioning devices per substrate be increased. One way to increase this output is to minimize the number of devices that fail due to contamination. Thus, increased cleanliness requirements are desired.

Accordingly, in the process of cleaning the surface of a substrate, a pressurized fluid can be supplied through a spray jet cleaning apparatus and applied continuously on the substrate surface in order to aid in the removal of contaminants on the substrate surface. The pressurized spray jet cleaning apparatus at times, however, may not be able to remove some contaminants or tiny particles on the substrate surface. The cleaning ability can thus be enhanced by raising the pressure of the fluid imparting higher velocity to the fluid as it exits the spray jet cleaning apparatus. However, the higher velocity fluid, while enhancing the cleaning ability of the spray jet cleaning apparatus, also increases the likelihood of damage to the substrate surface due to the force of the fluid or fluid droplets impacting the substrate surface.

Two-fluid spray jets may also be employed in the cleaning process. In using a two-fluid spray jet apparatus, a gas can be mixed with a fluid to form a cleaning mixture. The composition of the cleaning mixture, including the quantity and composition of any gas dissolved in the cleaning mixture, used in the substrate cleaning process can affect cleaning efficiency and the amount of damage caused to the substrate. However, two-fluid spray jets can also damage a substrate through cavitation of the gas bubbles on the substrate surface. This effect happens when the gas accelerated through the spray jet apparatus atomizes the fluid to form bubbles, these droplets then agglomerate together trapping gas under the agglomerated droplets especially as gas pressures are increased and collapse, i.e., implosion. During implosion of a bubble, the bubble tries to collapse from all sides. However, if the bubble is laying on or near a portion of the substrate surface or other material, it most often collapses towards the sensitive structure. This can cause substantial damage to the substrate surface to be cleaned.

However, if the spatial distance between droplets is increased, the inclination of the droplets to agglomerate can be minimized. One solution is to increase the internal diameter of the spray jet apparatus to much larger than 3.5 mm while using the same fluid flow rate. There are, however, disadvantages as the larger diameter spray jet apparatuses use a larger gas flow in order to achieve the same cleaning. This is not a preferred solution because the manufacturing fabrication site where the devices are made have a limit as to the amount of gas that can be used. About 90 psi is typically the maximum gas flow that can be supplied to a cleaning system.

Therefore, an idea such as that expressed in U.S. Pat. No. 5,918,817 where the gas would be approaching the speed of sound or acoustic velocity is not appropriate for general device manufacturing even when the internal diameter is near the 3.5 mm diameter. Also, a two fluid spray tends to create a turbulent effect when using the designs laid out in the above patent due to the area known as the mixing chamber. The mixing chamber is effective for breaking up the fluid into droplets but also consumes the material from the sidewall and makes using Teflon™ somewhat impractical due to wear. Teflon™ however is a preferred material from the device maker standpoint because of its chemical stability. The conical area in the mixing chamber may help to create mixing of gas and chemicals where mixing may not be preferred.

The invention disclosed in U.S. Pat. No. 6,048,409 is a spray jet apparatus that has a straight portion. This straight portion has a limiting effect as to the droplet size that can be created. This is addressed by supplying an outer ring of gas for an external small droplet formation and speed control. This increases the spatial distance between droplets to the detriment of the cleaning because only the droplets in the center flow are accelerated the fastest and are responsible for cleaning. This means a large portion of the fluid droplets forms a broadband mist reducing the overall efficiency of the spray jet yet the application to sensitive structures is maintained at the expense of cleaning. High cleaning efficiency is only maintained at above 100 m/s which is above the desired gas usage rate of device manufacturing, thereby requiring special gas delivery and not suitable for device damage control for Nano technology nodes.

Accordingly, there is a need for an improved spray jet cleaning apparatus and method that is able to provide effective cleaning efficiencies while minimizing damage to the surface of the substrate.

SUMMARY OF INVENTION

It is therefore an object of the invention to provide an improved spray jet cleaning apparatus.

It is also an object of the invention to provide an improved spray jet cleaning apparatus that minimizes damage caused to the substrate.

Another object of the invention is to provide a system and method of cleaning a substrate that minimizes damage to the substrate.

Yet another object of the invention is provide gas passages that increase the atomization of the fluid in the spray jet apparatus.

Another object of the invention is provide an acceleration passage that increases atomization of the fluid.

These and other objects are met by the present invention, which in one aspect can be an apparatus for processing a rotating substrate comprising: an atomizing unit having an atomizing chamber; a first gas passage for introducing a gas into the atomizing chamber along a first axis; a cleaning fluid passage for introducing a cleaning fluid into the atomizing chamber along a second axis so that the cleaning fluid combines with the gas to form a mixture within the atomizing chamber; an acceleration unit operably connected to the atomizing unit, the acceleration unit having an acceleration passage for spraying the mixture formed in the atomizing chamber onto a substrate surface; and wherein the first axis forms a non-zero acute angle with the second axis.

Another aspect can be a method for processing a substrate comprising rotating the substrate; providing a spraying device having an atomizing chamber; introducing a first gas into the atomizing chamber along a first axis; introducing a cleaning fluid into the atomizing chamber along a second axis, that forms a non-zero acute angle with the first axis so as to form a mixture in the atomizing chamber with the gas and the fluid; flowing the mixture through an acceleration passage; and spraying the mixture onto a surface of the substrate while rotating the substrate.

Yet another aspect of the invention can be an atomizing unit having an atomizing chamber; a first gas passage for introducing a first gas into the atomizing chamber, wherein the first gas passage terminates in an opening into the atomizing chamber, the opening having an elongated cross-sectional area; a cleaning fluid passage for introducing a cleaning fluid into the atomizing chamber so that the cleaning fluid combines with the gas to form a mixture within the atomizing chamber; an acceleration unit operably connected to the atomizing unit, the acceleration unit having an acceleration passage for spraying the mixture formed in the atomizing chamber onto a substrate surface.

DETAILED DESCRIPTION

Figure 1:
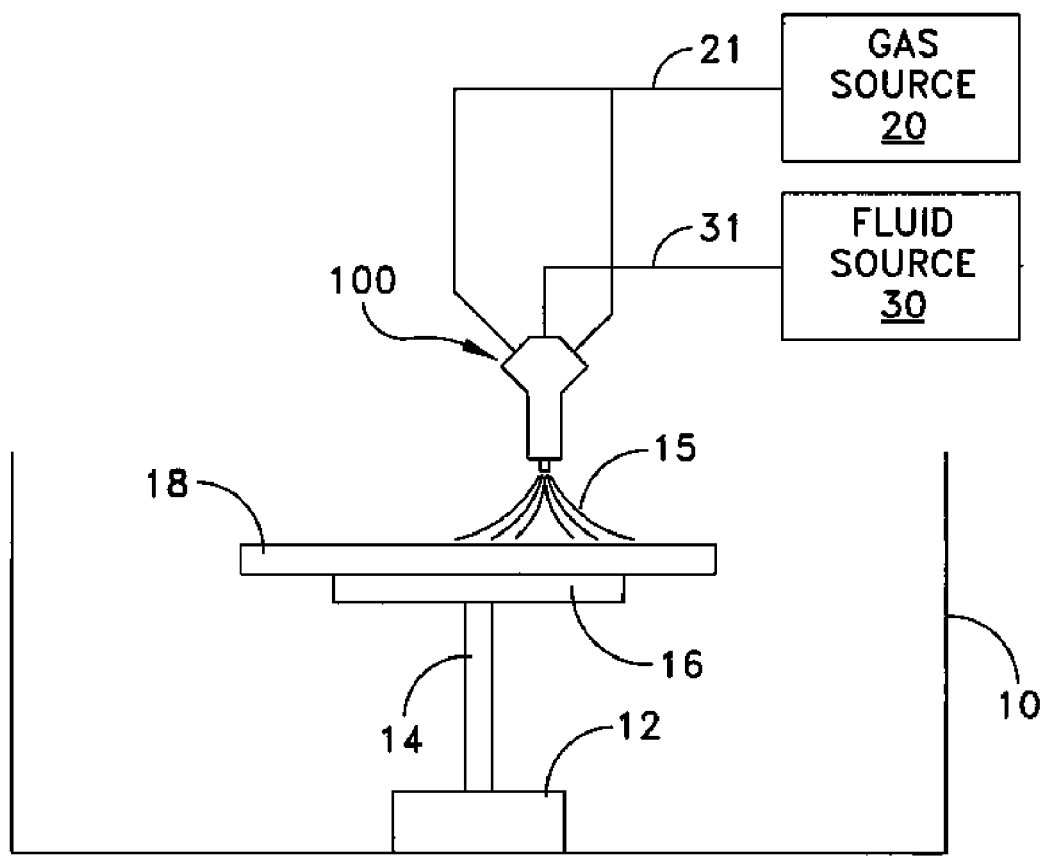
FIG. 1 is a schematic of the substrate processing system of the instant invention.

The present invention will now be described in detail with reference to the drawings, wherein like numerals reference the same subject matter, and referring now to FIG. 1, where a schematic generally illustrating the system in which the spray jet apparatus 100 is used shown. In the system shown in FIG. 1 a substrate 18 is held within a process chamber 10 on a substrate holder 16. The substrate holder 16 is positioned within the process chamber 10 and is adapted to rotatably support a substrate 18 in a substantially horizontal orientation. Preferably, the substrate holder 16 contacts and engages only the perimeter of the substrate 18 in performing its support function. The substrate holder 16 is operably coupled to a spindle 14 and a motor 12 to facilitate rotation of the substrate within the horizontal plane of support. The motor 12 is preferably a variable speed motor that can rotate the substrate holder 16 at any desired rotational speed. The motor 12 is electrically and operably coupled to a system controller (not illustrated), which controls the operation of the motor 12, ensuring that the desired rotational speed and desired duration of rotation are achieved.

The spray jet apparatus 100 is positioned close to the substrate 18 and dispenses the gas and fluid mixture 15 to the surface of the substrate 18. Gas lines 21 and fluid lines 31 are operably and fluidly connected to the spray jet apparatus 100. The gas lines 21 are fluidly and operably connected to both the gas source 20 and the spray jet apparatus 100. The fluid line 31 is fluidly and operably connected to both the fluid source 30 and the spray jet apparatus 100. A pressurized gas is supplied from the gas source 20 and a pressurized fluid is supplied from the fluid source 30. However, if chemical mixing of multiple cleaning fluids is needed, other fluid lines can be used and likewise configured. It should further be understood that more than one gas source 20 may be used as well as more than one fluid source 30. Furthermore, although the gas lines 21 are shown connected to only one gas source 20, they may be connected to a separate gas sources 20 in alternative embodiments.

Both the fluid source 30 and the gas source 20 are operably connected to and controlled by the system controller (not illustrated). The controller controls and regulates the flow of fluid for the substrate processing system through operable and electrical connections to the pumps, valves, sensors, etc. The controller can be a suitable microprocessor based programmable logic controller, personal computer, or the like for process control. The controller preferably includes various input/output ports used to provide connections to the various components of the substrate processing system that need to be controlled and/or communicated with. The electrical connections between the controller and the components of the fluid source 30 and the gas source 20 are provided as necessary. The controller also preferably comprises sufficient memory to store process recipes and other data, such as thresholds inputted by an operator, processing times, processing conditions, processing temperatures, flow rates, desired concentrations, sequence operations, and the like. The controller can communicate with the various components of the fluid source 30 and the gas source 20 in order to automatically adjust and maintain process conditions, such as the temperature of the fluid, flow rates, etc. The type of system controller used for any given system will depend on the exact needs of the system in which it is incorporated.

The invention is not limited to any specific gas, fluid or combination thereof. Examples of suitable gases include, without limitation, $NH_3$, $N_2$, $O_2$, He, Ar, air, $CO_2$, $O_3$ and the like. The gas can be any reactive gas, non-reactive gas, or combinations thereof. Used herein, the term gas is also intended to include the gaseous state of a substance which under ambient or ordinary conditions exists as a liquid or solid, i.e., vapor.

Examples of suitable fluids include but are not limited to deionized water, diluted hydrofluoric acid, hydrochloric acid, hydrogen peroxide, ammonia hydroxide, ammonia, Standard Clean 1 (ammonia hydroxide/hydrogen peroxide/deionized water), Standard Clean 2 (hydrochloric acid/hydrogen peroxide/deionized water), RCA solutions, dilute acids, dilute bases or semi-aqueous solvents, and RCA cleaning liquids, any combination thereof or the like. Used herein, the term fluid may encompass liquids, gases, and vapors. The exact fluid and/or gas used will depend on the cleaning process being performed, the type of substrate being processed, the size of the devices on the substrate, and the susceptibility of the devices to damage. In some embodiments, a gas may not be added to the fluid. In other embodiments, the fluid supply system can be adapted to mix multiple fluids for supply to the substrate 18 as a fluid mixture.

Figure 2:
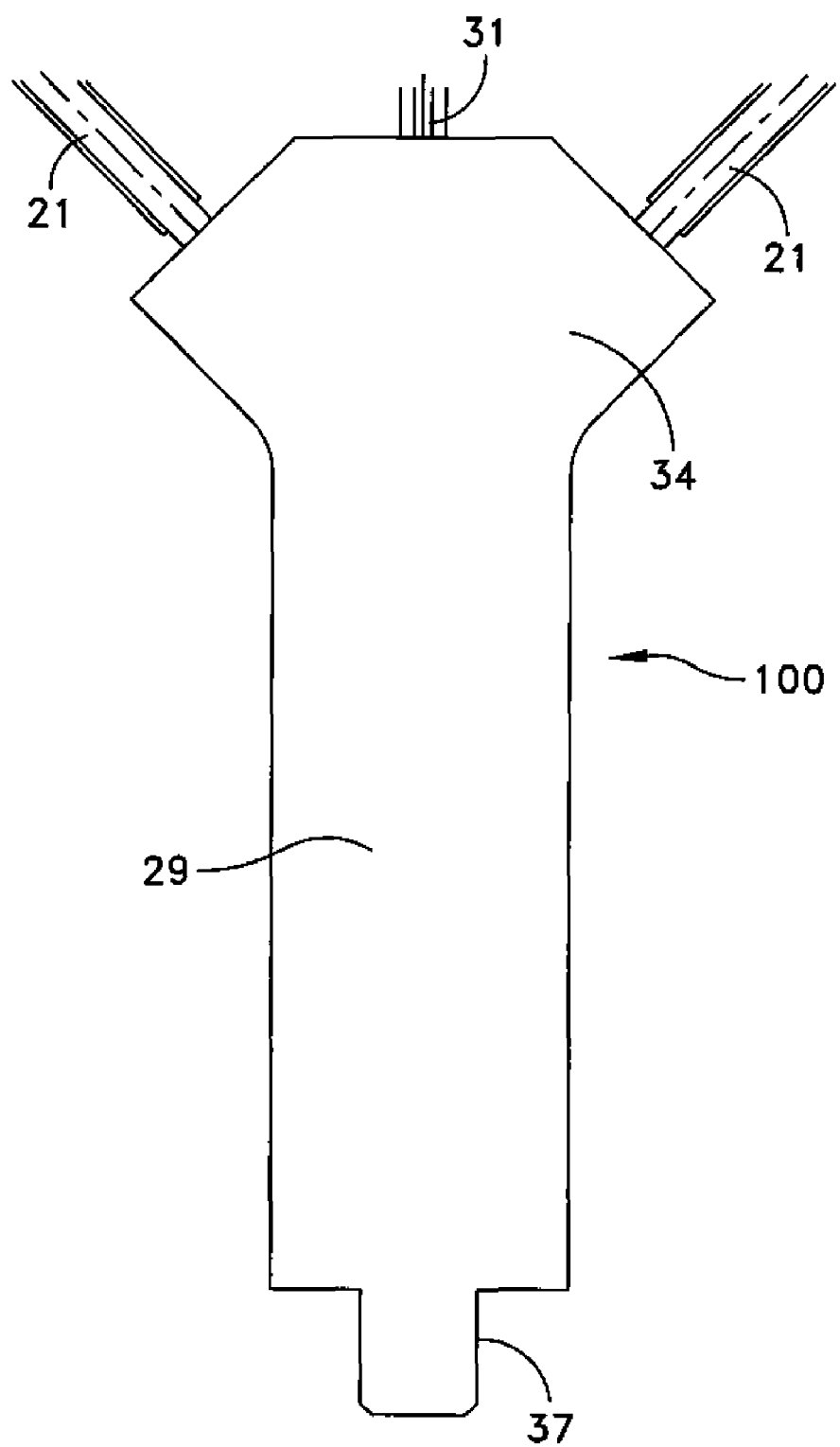
FIG. 2 is a front view of the spray jet apparatus according to one embodiment of the present invention.

Now turning to FIG. 2, where the spray jet apparatus 100 that is used in the system of FIG. 1 is shown. The spray jet apparatus 100 utilizes an internal atomizing unit 34, which is discussed in detail below, that is operably and fluidly connected to an accelerating unit 29. A nozzle 37 is located at the distal end of the accelerating unit 29 and operates to discharge the gas and fluid mixture 15 to the surface of the substrate 18.

Figure 3:
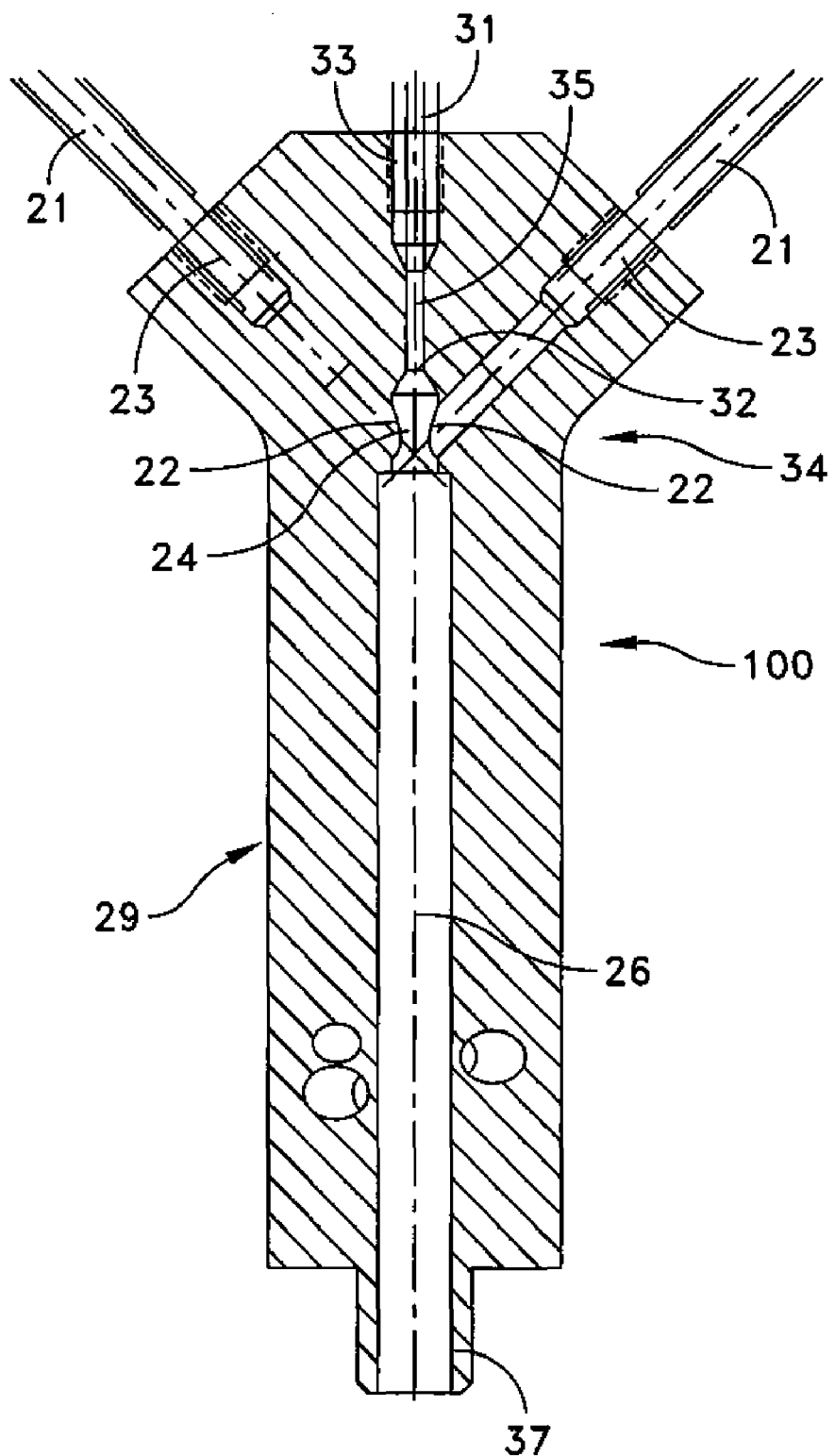
FIG. 3 is a cross-sectional view of the spray jet apparatus, in accordance with the embodiment shown in FIG. 2.
Figure 4:
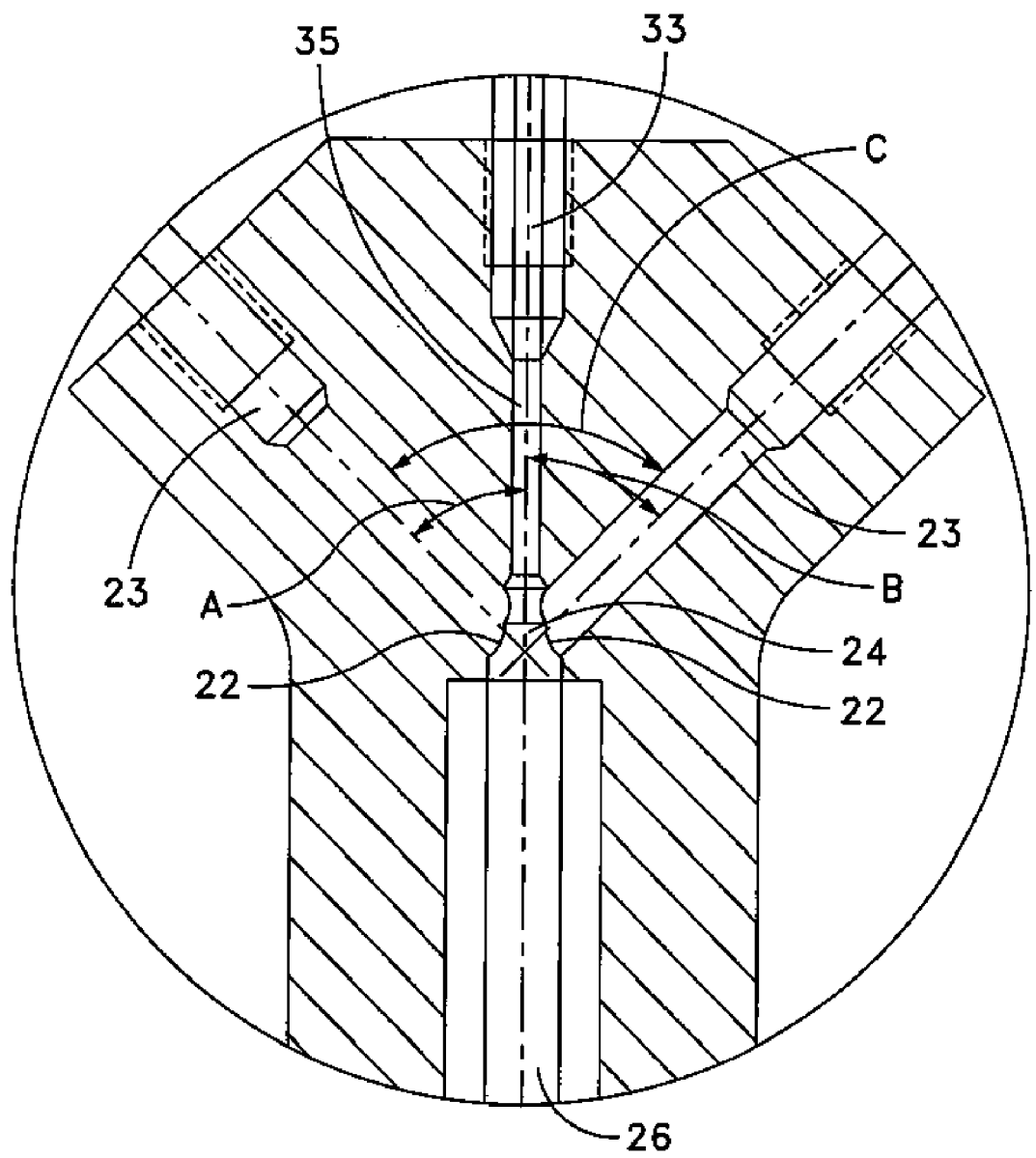
FIG. 4 is a view of the atomizing unit of the spray jet apparatus shown in FIG. 3, in accordance with an embodiment of the present invention.

Now referring to FIGS. 3 and 4 where a cross-sectional view of the spray jet apparatus 100 shown in FIG. 2 is shown. The atomizing unit 34 has one or more gas passages 23 having gas outlets 22 that open up into the atomizing chamber 24. Preferably the gas passages 23 and the fluid passage 33 are tubular in shape. The atomizing chamber 24 preferably forms a tube like area in which the gas and the fluid are mixed. It should be understood that the size and shape of the atomizing chamber 24 may be other than tubular shaped and can be changed depending upon the nature of the atomization that is to occur for a specific type of processing. The gas lines 21 are fluidly and operably connected to the gas passages 23. Each of the gas passages 23 may be connected to gas lines 21 that are connected to different gas sources 20 and/or each of the gas lines 21 may be connected to one or more gas sources 20. The spray jet apparatus 100 also has at least one fluid passage 33 operably connected to the atomizing chamber 24 and fluidly and operably connected to the fluid line 31. The fluid passage 33 may be connected to more than one fluid line 31 and/or multiple fluid passages 33 may be connected to different fluid sources 30. It should be understood that more than one fluid passages 33 or gas passages 23 may be provided depending on the needs processing recipe that is to be used.

The atomizing unit 34 can be comprised of any suitable rigid material including but not limited to plastic composites, quartz, rubber, metal composites or the like. The atomizing unit 34 can be formed through a number of techniques generally known in the art, including but not limited to conventional injection-molding techniques.

In the preferred embodiment, the gas passages 23 and the cleaning fluid passage 33 are defined in a plastic housing. In another embodiment, the gas passages 23 and the fluid passage 33 are defined by suitable materials such as tubes housed within, inserted into or operably connected to the plastic housing. The gas passages 23 and the cleaning fluid passage 33 allow for gas and fluid to flow through when the gas passages 23 and fluid passages 33 are operatively and fluidly coupled to the gas source 20 and the fluid source 30, respectively. The gas passages 23 and the fluid passage 33 pass through the gas outlets 22 and the fluid outlet 32 into the atomizing chamber 24 where gas flowing though the gas passages 23 and cleaning fluid flowing through the fluid passage 33 combine to form a gas and fluid mixture 15.

The gas passages 23 and the fluid passage 33 may have a circular cross-sectional area, with a diameter of between about 0.05 and 0.4 inches. Preferably the gas passages 23 and the fluid passages 33 have a circular cross-sectional area of between about 0.1 to 0.3 inches. Also, as shown in FIGS. 3 and 4, the fluid passage 33 can have a cross-sectional area that tapers into a smaller cross-sectional area fluid passage 35 before converging with the gas passages 23. The cross-sectional area of the fluid passage may be between 0.05 and 0.4 inches. Preferably, the smallest cross-sectional area of the fluid passage 35 is in the range of about 10% to 40% of the widest cross-sectional area of the cleaning fluid passage 33.

Still referring to FIGS. 3 and 4, the gas passage 23 and the fluid passage 33 may be disposed at certain angles relative to one another and to the acceleration passage 26 of the accelerating unit 29, which will be described in more detail below. The gas passages 23 are operably connected to the atomizing chamber 24 and the acceleration passage 26 of the spray jet apparatus 100. The fluid passage 33 may be disposed at an angle from 0 to 45 degrees with respect to the acceleration passage 26. In the embodiment shown in FIGS. 3 and 4 the axis of the fluid passage 33 is aligned with the axis of the acceleration passage 26 (i.e. has an angle of 0 degrees with respect to the axis of the acceleration passage). The fluid passage 33 is operably connected to the acceleration passage 26 along the first axis of the acceleration passage 26

In some embodiments, other chemicals may need to be introduced into the atomizing chamber 24 so various angles may be used for providing the fluid relative to the gas passages 23, thereby providing for the fluid from the fluid passages 33 to enter the atomizing chamber 24 from an angle at the point where both the gas from the gas passages 23 and the fluid from the other fluid passages 33 may converge. In a preferred embodiment, the fluid passage 33 and the gas passages 23 form a 45 degree angles relative to one another in order to provide for the most effective atomization of the fluid. By having the gas passages 23 located relative to the liquid passage 33 at the preferred angles results in the gas converging with the fluid at an angle that maximizes atomization.

In the embodiment shown, the gas from the gas passages 23 is introduced along with the fluid from the fluid passage 33 into the atomizing chamber 24 at angles A-C, shown in FIG. 4. The axis of the first gas passage 23 is disposed at an non-zero acute angle relative to the axis of the fluid passage 33 and preferably at an angle from about 30 to 75 degrees. This is shown as angle A in FIG. 4. It should be understood that it is possible for portions of the fluid passage 33 and/or the gas passage 23 that do not introduce their respective fluids into the atomizing chamber 24 may be oriented in different directions so long as the portions that introduce the gas or fluid to the atomizing chamber 24 are angled as described herein. The other gas passage 23 shown is disposed at a non-zero acute angle relative to the axis of the fluid passage 33 and preferably at an angle from about 30 to 75 degrees.

This is shown as angle B in FIG. 4. Preferably the gas passages 23 may be disposed at angles from about 40 to 50 degrees relative to the axis of the fluid passage 33, which in the embodiment shown is also between 40 to 50 degrees relative to the axis of the fluid passage 33 and is the same as angles A and B in FIG. 4. In the embodiment shown angles A and B are also relative to the acceleration passage 26 since the axis of the acceleration passage is aligned with the axis of the fluid passage 33. In the embodiment shown the gas passages 23 may be at a substantially 90 degree angle with respect to each other. This is shown as angle C in FIG. 4. In a preferred embodiment, the first and second gas passages 23 are located on opposing sides of the first axis of the acceleration passage 26.

The acceleration passage 26 is operably and fluidly connected to the gas passages 23 and the fluid passage 33 through the atomizing chamber 24 at the point at which the gas and fluid combine to form the mixture. The acceleration passage 26 is adapted to spray the mixture onto the substrate 18, such that the mixture flows through the acceleration passage 26 and exits through a nozzle portion 37 at an end of the acceleration passage 26. The acceleration passage 26 can vary in length, and is preferably between about 0.1 inches and about 7.0 inches in length, and, more preferably, between about 0.2 inches and about 3.5 inches in length. In one embodiment, the length of the acceleration tube has a cross-sectional area in the range of about 1.0 mm to 7.0 mm, preferably, about 4.0 mm in diameter. The acceleration passage 26 further operates to additionally atomize the cleaning fluid when it passes through the acceleration passage 26.

The accelerating unit 29 can be comprised of any suitable rigid material including but not limited to plastic, plastic composites, rubber, metal composites or the like, and can be formed through a number of techniques generally known in the art, including but not limited to injection-molding techniques. In the preferred embodiment, the acceleration passage 26 is defined within the plastic housing of the spray jet apparatus 100. In another embodiment, the acceleration passage 26 is defined by suitable materials such as metal or plastic tubes housed within, inserted into or operably connected to the plastic holding.

Figure 5:
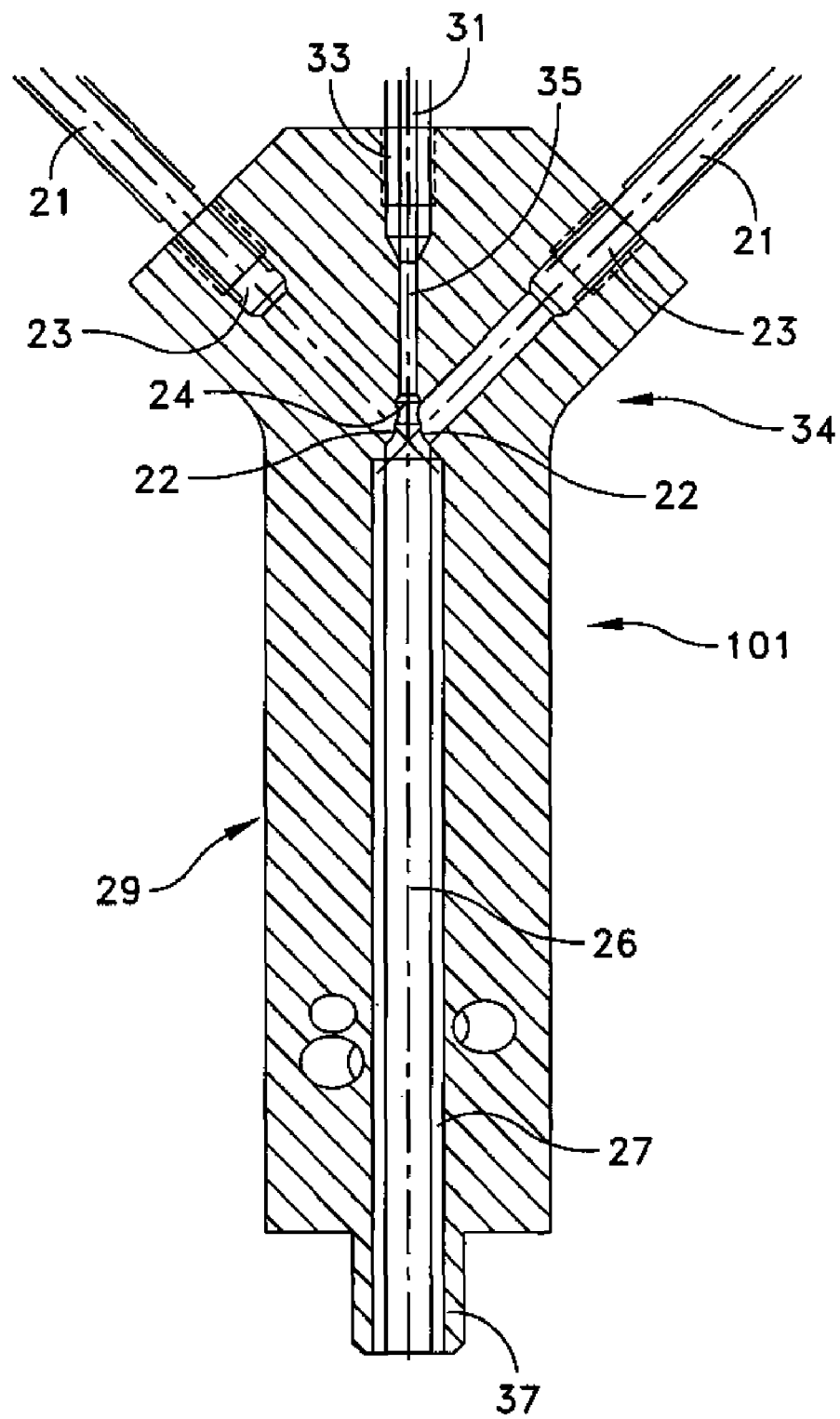
FIG. 5 is a cross-sectional view of the spray jet apparatus having a tube insert placed within the acceleration tube, in accordance with an alternative embodiment of the present invention.
Figure 6:
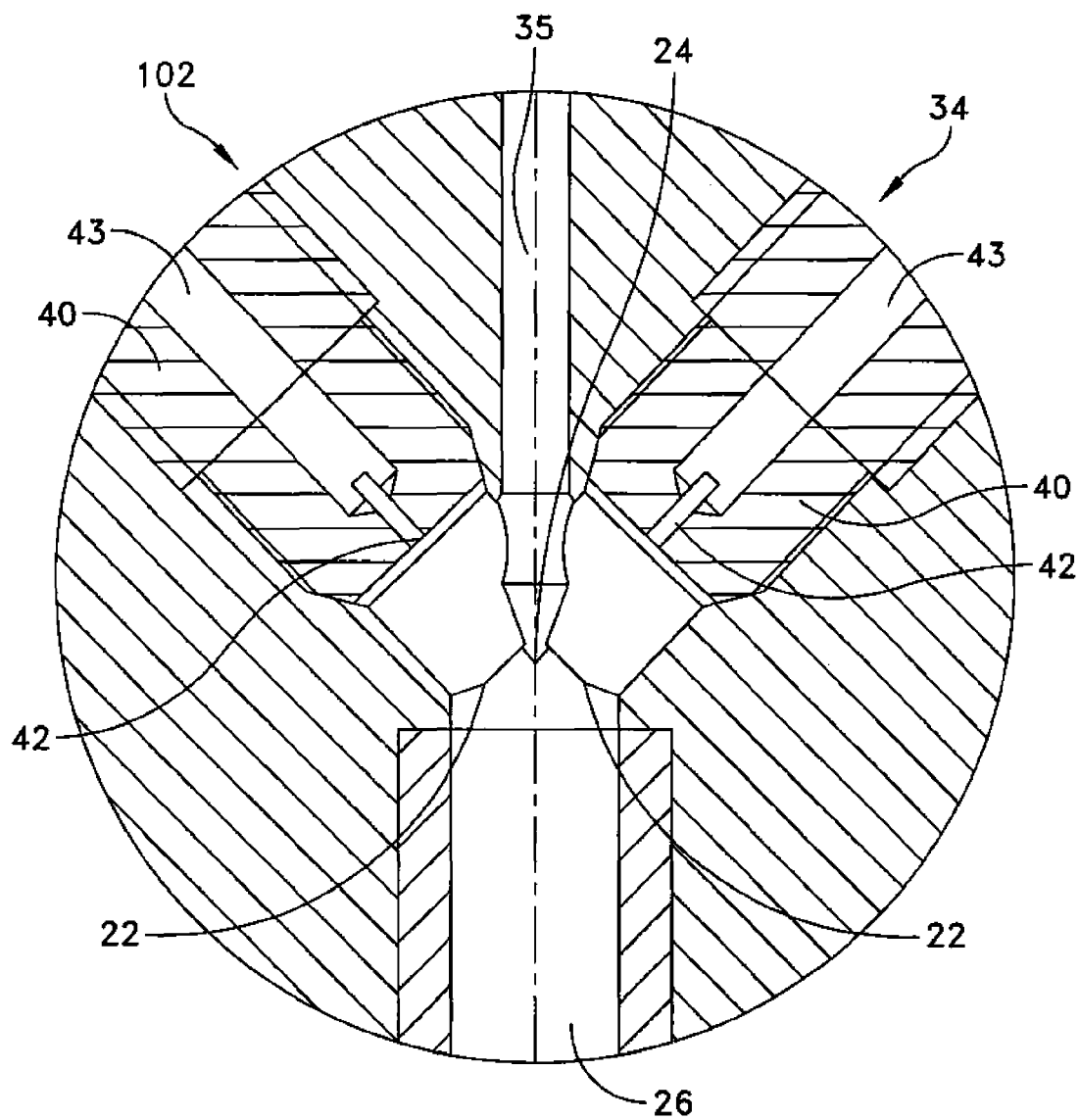
FIG. 6 shows a view of the atomizing unit of a spray jet apparatus having rectangular openings for the gas, in accordance with an alternative embodiment of the present invention.
Figure 7:
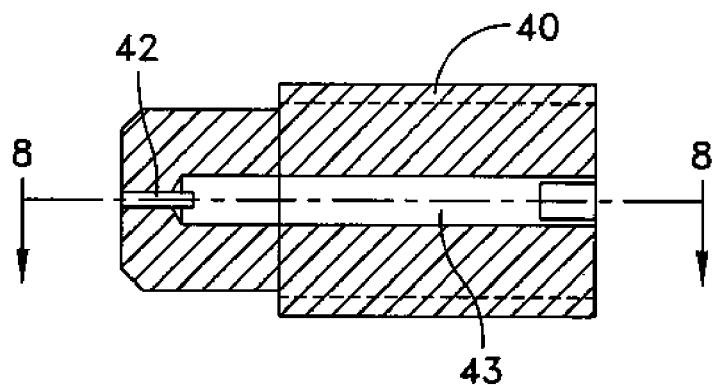
FIG. 7 shows a cross-sectional view of the set screw in accordance with an embodiment of the present invention.
Figure 8:
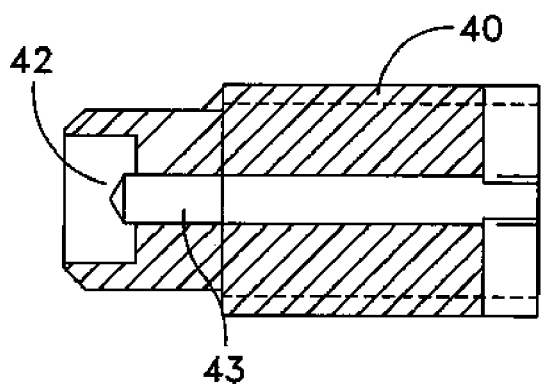
FIG. 8 shows an cross-sectional view of the set screw shown in FIG. 7 taken along the line B-B.

Referring to FIG. 5, in an alternative embodiment, a spray jet apparatus 101 has a extruded tube 27 that is inserted into the acceleration passage 26. The tube 27 can be integral to the acceleration passage 26, but it is preferred that the tube 27 be capable of being removed from and secured within the acceleration passage 26. The tube 27 is preferably hydrophobic in nature, which prevents fluid from agglomerating on the walls of the tube 27 and increases the efficiency of the droplets once formed. The tube 27 can be made of polytetrafluoroethylene or any other hydrophobic material. Constructing the tube 27 of hydrophobic material can limit the potential for damage generally for various gas and fluid types. It is also possible to construct the tube 27 of a hydrophilic material. Construction out of a hydrophilic material will cause droplets once formed to become attached to the side wall and to have a low probability to re-enter the main stream of the droplet flux. However, to optimize the effect, smooth hydrophobic acceleration tubes are preferred.

It is preferred that the tube 27 be smooth and free of burrs. The tube 27 insert also allows quick changes to the internal diameter of the nozzle 37 and the acceleration passage 26. It also permits optimization of height from the output of the nozzle 37 to the surface of the substrate for various processing applications and optimization testing. It should be understood that the acceleration passage 26 and the tube 27 can vary in length, from preferably between about 0.1 inches and about 7.0 inches in length, and, more preferably, between about 0.2 inches and about 3.0 inches in length.

Usage of a hydrophobic tube 27 can affect the average size of droplets formed during the use of the spray jet apparatus 101. The usage of the hydrophobic tube 27 versus non usage can reduce the droplet size from between 45 μm to 80 μm to between 25 μm to 50 μm.

Referring now to FIGS. 6-9, where an alternative embodiment of the spray jet apparatus 102 is shown that employs the usage of removable set screws 40 in the atomizing unit 34. The embodiment shown in FIGS. 6-9 improves the atomization of the fluid by the gas. The usage of the set screws 40 permits the usage of outlets 42, which have an elongated cross-sectional area. Using the removable set screw 40 permits easy exchanging of the set screw 40 and simple adjustment to the size of the outlet 42.

In the embodiment shown in FIGS. 6-9 the outlet 42 is rectangular in shape. When the set screw 40 is placed within the gas passages 23 of the atomizing unit 34, gas enters the set screw 40 through the set screw gas passage 43 and exits through a rectangular shaped outlet 42.

When the set screw 40 is not being used in spray jet apparatus 100, it is possible for the fluid that is used during the cleaning to not be fully atomized in the atomizing chamber 24. This occurs because some of the fluid that exits from the fluid passage 35 and enters the atomizing chamber 24 does not have to travel through the cylindrically shaped streams of gas that exit from the gas passages 23. Some of the fluid manages to go around the gas stream and avoid becoming atomized. Therefore, by using the set screw 40 and the rectangular shaped outlet 42 the ability of the fluid to avoid the gas stream is minimized.

When using the set screw 40, the gas passage 43 forms a part of the gas passage 23 and typically forms a smaller cross-sectional area than the gas passage 23. The gas passes through a first zone of the gas passage 23 that has a cross-sectional area larger than second zone formed by the gas passage 43. After passing through the second zone formed by the gas passage 43, the gas is then introduced into the atomizing chamber 24 through the outlet 42 which typically has a cross-section area that is larger than the cross-sectional area of the gas passage 43 forming the second zone but smaller than the cross-sectional area forming the first zone.

Figure 9:
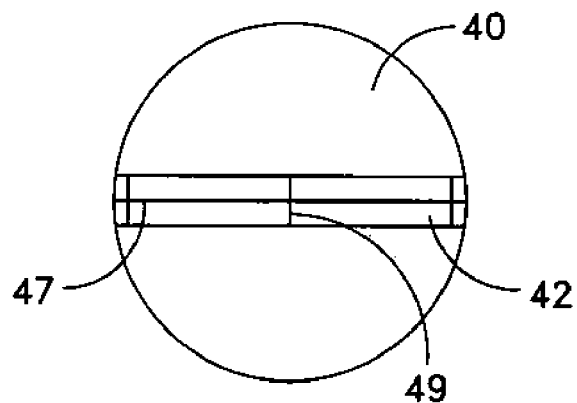
FIG. 9 shows a view of the opening if the set screw shown in FIG. 7 and FIG. 8 in accordance with an embodiment of the present invention.
Figure 10:
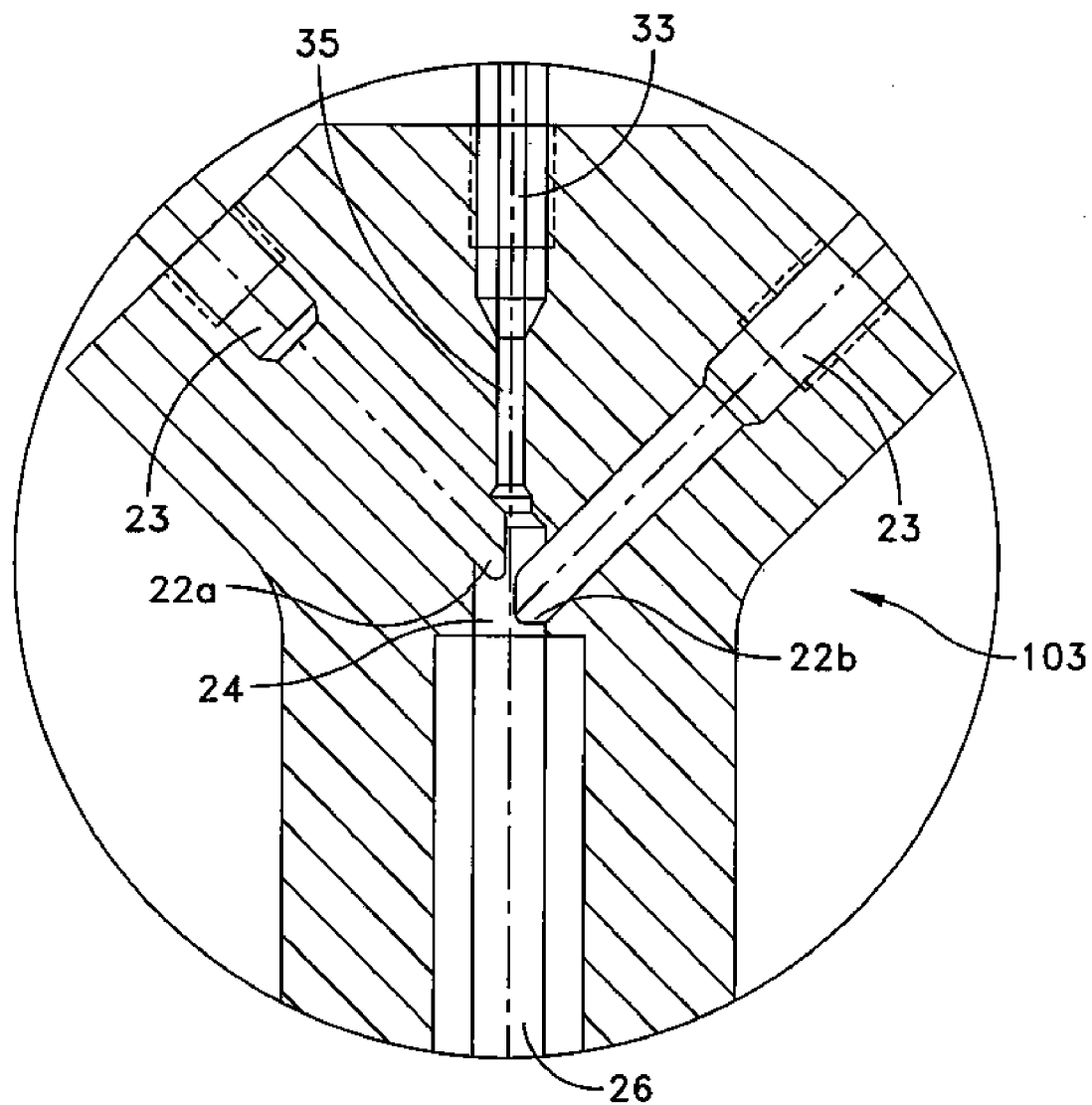
FIG. 10 shows a cross-sectional view of a spray jet apparatus according to an alternative embodiment of the present invention.

In FIGS. 6-9, the gas enters the set screw gas passage 43 from the gas passage 23 and exits through the outlet 42 in a rectangular shape. As shown in FIG. 9, the outlet 42 has a major axis 47 and a minor axis 49, where the length of the major axis 47 is greater than the length of the minor axis. In the embodiment shown in FIGS. 6-9, the width of the rectangular shaped outlet 42 is typically as wide as the gas passage 23. Although shown and described herein as rectangular shaped, the outlet 42 is not so limited and may be any shape having an elongated cross-sectional area that has a major axis greater than a minor axis, such as ovals, ellipses, diamonds, slits, trapezoids and irregular shapes.

In the embodiment shown, the rectangular shaped gas stream remains in the same shape until it collides with the other rectangular shaped gas stream. When the gas streams are shaped in this manner, the fluid has to pass through the gas streams and become atomized. In some embodiments, the width of the gas outlets 42 may be as wide as the atomizing chamber 24 in order to ensure that the gas streams are sufficiently sized so that no fluid may pass through the atomizing chamber 24 without becoming atomized.

By using an outlet 42 with an elongated cross-sectional area it is also possible to reduce the area of the outlet 22, typically used without causing subsequent complications during the atomization process. The reduction in cross-sectional area increases the velocity of the gas that exits the outlet 42 without needing to increase the gas flow rate. The cross-sectional area of the gas passage 43 within the set screw 40 is less than the cross-sectional area of the remainder of the gas passage 23, which increases the velocity of the gas. The cross-sectional area through which the gas is then introduced to the atomizing chamber 24 is then increased at the outlet 42. This improves the atomization that occurs inside the atomizing chamber 24.

It should be understood that although the set screw 40 is described above as being removable, it is possible to construct the atomizing unit 34 and the gas passages 23 to have rectangular shaped gas streams and a rectangular shaped outlet 42. The overall structure may be constructed with having the features disclosed above. However, by using a removable set screw 40, the internal structure of the atomizing unit 34 can be altered in a simple fashion.

Now turning to FIG. 10, where a spray jet apparatus 103 is shown according to an alternative embodiment of the invention. In FIG. 10, a gas outlet 22*a* forms a 180° opening in the atomizing chamber 24 in order to dispense gas from the gas passage 23. Preferably the atomizing chamber 24 forms a tube-like area in which the gas and fluid are mixed. The opening of the gas outlet 22*a* is preferably rectangular shaped and is the same width as the diameter of the acceleration chamber 24. A gas outlet 22*b* may be located on the opposite side of the acceleration chamber 24 and form a complimentary 180° arc to the arc formed by the gas outlet 22*a*. The gas outlets 22*a* and 22*b* effectively encompass the entire circumference of the atomizing chamber 24 so as to ensure that no fluid that enters the atomizing chamber 24 can avoid being atomized.

In FIG. 10, the gas outlet 22*a* is shown located above the gas outlet 22*b* however the invention is not so limited and gas outlet 22*b* may be located above gas outlet 22*a*. Furthermore, more than two gas outlets may be used and combinations of three or more may be used depending on the number of gas passages 23 that are being used with a particular spray jet apparatus. In the event that three or more are used it is possible that the shape of the outlets may be varied or altered. For example, rectangular shaped arcs greater than 180° or less than 180° may be used (e.g. three 120° rectangular shaped arcs could be used when using three gas passages 23) so long as the circumference of the atomizing chamber 24 is effectively covered. Additionally, the shape of the outlets are not limited to being rectangular shaped but may vary depending on the shape of the sides of the atomizing chamber 24, such as circular, square, triangular, etc. and may only be arc shaped when the surface of the atomizing chamber 24 is curved.

Now turning to the use and application of the spray jet apparatuses described above. In describing the use and function of the spray jet apparatuses reference will generally be made to spray jet apparatus 100, however it should be understood that the use and function of spray jet apparatus is generally applicable to the other embodiments discussed above.

When used, the spray jet apparatus 100 of the present invention is adapted to create small droplets that are generally unaffected by the gas flow used. It possible to have a gas flow of up to about 100 m/s without the need to change the fluid flow rate. Generally the droplet size in the main flux of the acceleration point is about 20-30 um, which creates an effective spatial difference between droplets while not increasing the diameter of the nozzle 37 and/or the acceleration passage 26.

One benefit of this technique is the decrease in or absence of deterioration within spray jet apparatus 100 because the droplets are atomized in the atomizing chamber 24 by the opposing gas passages 23 which are set at the specific angles to minimize the droplet formation. Additionally, atomization may occur in the acceleration passage 26. Another aspect of this design is that there is a limit to the effects of backpressure on the fluid passage 33 at higher gas flows. Furthermore, another aspect to the design is the ability to narrow the gas delivery port to effectuate the atomization effect. The extruded tube 27 as well as the acceleration passage 26 can be easily narrowed to generate higher velocities and larger or smaller droplet sizes. Therefore, another aspect of the present invention is an advanced hybrid model of an external mixing and internal mixing spray jet apparatus where it is recognized that in having an internal atomizing chamber 24 that the fluid flow rate can be affected by high gas pressures.

The droplet characteristics are also affected by the gasses and fluid(s) used. The gasses can comprise any suitable carrier gas including but not limited to $CO_2$, $N_2$, CDA, Argon, Helium, Oxygen, Ozone, a chemical vapor, or combinations thereof and the like. Used herein, the term gas is also intended to include the gaseous state of a substance which under ambient or ordinary conditions exists as a liquid or solid, i.e., vapor.

The fluid includes but is not limited to deionized water, diluted hydrofluoric acid, hydrochloric acid, hydrogen peroxide, ammonia hydroxide, ammonia, Standard Clean 1 (ammonia hydroxide/hydrogen peroxide/deionized water), Standard Clean 2 (hydrochloric acid/hydrogen peroxide/deionized water), RCA solutions, dilute acids, dilute bases or semi-aqueous solvents, and RCA cleaning fluids, any combination thereof or the like.

In another embodiment, solvents may be used to remove polymer. Many solvents rely on the inhibition of etchant chemicals since a lack of water protects substrate topographies that have small geometries from being over etched and corroded. In embodiments that use solvents for removal of polymers, the system may switch from solvent to fluid spray to a side dispensing rinse and back to a solvent two fluid spray to selectively remove the polymer without causing corrosion or over etching of the sensitive topography.

In one embodiment, when using $CO_2$ gas with water or other chemicals such as dilute ammonia or other chemicals, the present invention effectuates keeping the $CO_2$ from mixing with the droplets because there is no atomizing chamber or conical area large enough to affect the pH of the fluid internal to the droplet. Only the outside of the droplet has time to interact with the $CO_2$. Therefore the cleaning of DI water and ammonia and other chemicals can be maintained yet the damage is substantially decreased by as much as 5 to 1 as compared with the conventional method.

Using $CO_2$ gas dissolved in water is not ideal because the pH of the fluid is compromised to below 6 and particle removal may suffer as a result. The hydrodynamic cavitation damage that is formed by agglomerated droplets under pressure with un-dissolved gas can be controlled when using a carrier gas such as $CO_2$ gas to soften the cavitation implosion. $CO_2$ can be used whether the cavitation is forming from the bubble agglomerations under high pressure or from hydrodynamic cavitational forces and fluid shear stress from jetting due to droplet-to-droplet jetting cross currents because of spatial proximity of collision points. There are other fluid properties that can be manipulated to reduce the formation of cavitation as well. Solvents such as IPA, Acetone and others in their pure form tend not to cavitate but also tend not to clean. These solvents can be used in semi-aqueous mixtures where the fluid is more than 70% water and 30% or less solvent to form wetting actions at the surface and a softening of the cavitational forces associated with damage to sensitive structures while still maintaining a high cleaning efficiency and due to the wetting effect can actually increase the cleaning w/o increasing the damage.

Through the use of $CO_2$ gas or any other suitable gas, the spray jet cleaning apparatus 100 of the present invention can allow for higher pressures of the mixture applied to the surface of a substrate without causing damage or causing only minimal damage to the substrate. As it has been discovered that substrate surface damage is caused by cavitation effects, the present invention is adapted to control the cavitation implosion such that the cavitation implosions on the substrate surface are softer.

The present invention also allows for improved cleaning of a substrate because it allows for more control of the size of the mixture droplets. Thus, many small mixture droplets can be accelerated in a concentrated form through the accelerating unit 29 and onto the surface of the substrate 18. Because an external atomizing unit is not used, a benefit is created due to having droplet mixing occur on the surface of the substrate 18. Since for single substrate processing the time to process a substrate is the easiest way to increase throughput, the spray jet apparatus 100 can achieve these ends. As the spray jet apparatus 100 creates small droplets to dispense at the substrate surface the droplet size is more or less maintained through a number of gas pressure increases up to the maximum that a semiconductor fabrication plant can supply to the clean tool, which can be up to 90 psi or more. This permits for quicker processing times.

In another embodiment N2, air and other gasses can be used with a better selectivity of cleaning over damage due to the reduction in droplet size and the focused area of the small droplets due to the collimation that occurs in the acceleration unit 29.

In a further embodiment heated gas and/or fluids may be used with the atomizing unit 34, the acceleration unit 29 and/or the nozzle portion 37. The heat creates a lower viscosity for the fluid and can generate smaller droplets with more cleaning action. The term heated is used refer to temperatures of gas and/or fluids that are above ambient temperatures.

Additional cleaning action is generated due to the number of droplets impinging on the substrate 18. This can occur by using the same fluid flow rate. Heated gas and/or fluid can increase the cleaning effect without increasing damage to the substrate 18. This can lead, for example, to above a 80% cleaning efficiency when using spray with an output flow of 20 m/s. Where a 45 nm poly gate has been found to be able to have applied to it a 80 m/s output spray without being damaged. The usage of heated gas and/or fluids can extend cleaning technology into the nanotechnology area.

Figure 11:
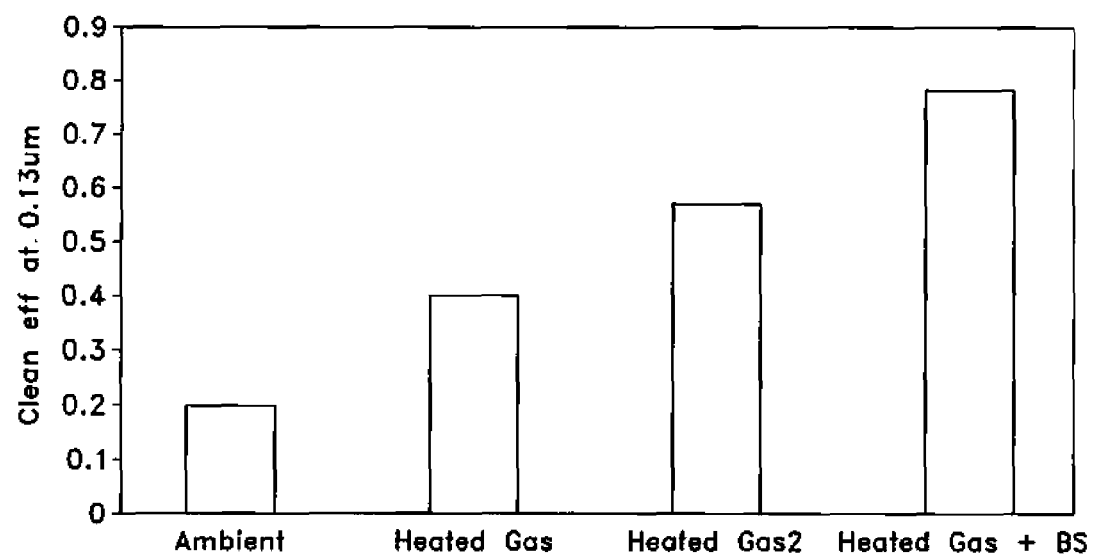
FIG. 11 is a graph depicting cleaning efficiency when using heated gas in a spray jet apparatus.

In FIG. 11 a graph depicting cleaning efficiency when using heated gas in the spray jet apparatus 100 is shown. The graph depicts the results of using heated $N_2$ gas with de-ionized water on a 300 mm substrate. The mixture was applied to the surface of the substrate for 30 seconds. The cleaning efficiency was measured when using gas at ambient temperature, gas heated to two different temperatures and heated gas used with backside cleaning. Using heated gas increased the cleaning efficiency when using flows that were four times less than what is used normally.

In yet another embodiment, the diameter of the atomizing chamber 24 and the diameter of the acceleration passage 26 of the acceleration unit 29 may be decreased by small increments to increase the velocity of the aerosols without increasing the gas usage at the same pressure and fluid flow rate. This can be done by either physically changing the structure of the atomizing chamber 24 and the acceleration unit 29 or by using tube inserts with the acceleration passage 26. As a result, the droplets may become larger due to a decrease in the size of the atomizing chamber 24, making it less effective at droplet breakup. The time allowed to break the particles up has been decreased allowing more aggressive droplets to form. This may be important for some scrubber replacement applications and if this kind of cleaning is required.

In alternative embodiments of the present invention it is possible to combine the spray jet apparatus 100 with additional cleaning and drying assemblies. Several aspects of the spray jet apparatus 100 and the chemical delivery system may combined into one head. For example, a STG Drying assembly may be combined with the spray jet apparatus 100 and advanced etch nozzle. Other designs may involve a combination with a micro stream, or spray of chemical and a spray jet rinse and/or combined with a Goldfinger® rinse. Other combinations may include multiple nozzle heads that help speed up the processing for chemical rinse and dry. The combinations used depend on the process steps that the combined tool may be used for. With the combinations better use may be achieved with the usage of linear arm movement instead of radial arms that have less per pass accuracy, but product-wise allow more arms in a small space. However, for nanotechnology applications it is believed that uniform arm movement over the substrate is desirable because many of the devices are only a few molecules thick.

A spray jet apparatus 100 may be used with a micro dispense apparatus. Techniques may be employed with the technology of the present invention, where 20 μm droplets are formed from the spray. With one pass of spray, a micro layer of chemical can be put down. This decreases the cost of chemical consumption of expensive solvents. In FEOL (Front End of Line processing), some etching chemicals such as BOE and others are affected by re-circulating them after seeing the device pushing a solution for single pass point of use chemical delivery. This provides a solution for ongoing metal contamination in the re-circulated fluid even for single substrate where costs always need improvements. Etch rates inevitably decrease when micron layers of chemicals are used to process a wafer allowing the extendibility of normally used chemicals and their selectivity on sensitive nanomaterials.

In another embodiment turbulent generation can be added to employ a circular helical gas movement down the acceleration unit 29 by off centering the two gas passages 23 with respect to each other. This will cause the gas to form a vortex that can be used to clean particles with more sideways oriented droplets. This effect can be optimized to generate a form of heated and cooler zones by way of a vortex that can be used to control damage and improve particle removal. Alternatively, helical grooves can be added to the acceleration passage 26 or alternatively to the tube 27 in achieve the same effect.

In yet another embodiment, the combination apparatus may have a spray jet apparatus 100, a micro chemical and chemical quench rinse, or a reactive chemical, thereby creating special chemical reactions for advanced processing. This can be used for photo resist strip processes where an advanced exothermal reaction can be set about by mixing sulfuric and hydrogen peroxide in order to generate temperatures above 180 degrees Celsius to promote high dose implanted wafer striping and quick low dosage processing. The main combination apparatus component can be tilted so that multiple chemical lines and at least two gas atomizing nozzles providing short lived chemical reactions can be directed at the surface of the substrate. This is not limited to the number and chemical and gas types mentioned above. This method may be used to generate advanced cleaning using a post etch of a poly silicon gate, oxide trench, aluminum line or other technology where polymer removal was not effective when using chemicals alone.

In yet another embodiment heated gas and steam can be used to break up crust on the surface wafer with photoresist where the use of aggressive chemicals is undesirable. The hot steam fluid spray can be used to break down the polymer crust so as to allow a less aggressive chemical to be used for the final removal on the unwanted photoresist.

In yet another embodiment, the combination of sensitive low power megasonics with a spray jet apparatus 100 may be used to reach the desired cleaning efficiency. This can also be used to reduce process time. Megasonic cleaning may be run for a standard 30 seconds or less and then a short spray rinse may be applied at very conservative levels while maintaining desirable cleaning of small particles.

While a number of embodiments of the current invention have been described and illustrated in detail, various alternatives and modifications will become readily apparent to those skilled in the art without departing from the spirit and scope of the invention.

What is claimed is:

1. An apparatus for processing a rotating substrate comprising:
an atomizing unit having an atomizing chamber;
a first gas passage terminating in an opening into the atomizing chamber for introducing a first gas into the atomizing chamber along a first axis, the opening being formed in a removable set screw that forms a portion of the first gas passage;
a cleaning fluid passage for introducing a cleaning fluid into the atomizing chamber along a second axis so that the cleaning fluid combines with the first gas to form a mixture within the atomizing chamber;
an acceleration unit operably connected to the atomizing unit, the acceleration unit having an acceleration passage for spraying the mixture formed in the atomizing chamber onto a substrate surface; and
wherein the first axis forms a non-zero acute angle with the second axis so that the first gas and the cleaning fluid converge within the atomizing chamber at the non-zero angle.

2. The apparatus of claim 1 wherein the non-zero acute angle is between 30 to 70 degrees.

3. The apparatus of claim 1 wherein the non-zero acute angle is substantially 45 degrees.

4. The apparatus of claim 1 wherein the first gas and the second gas are the same and are selected from the group consisting of CO2, N2, CDA, Argon, Helium, Oxygen, Ozone and combinations thereof.

5. The apparatus of claim 1 wherein the cleaning fluid is selected from the group consisting of deionized water, diluted hydrofluoric acid, hydrochloric acid, hydrogen peroxide, ammonia hydroxide, Standard Clean 1, Standard Clean 2 and combinations thereof.

6. The apparatus of claim 1 wherein the acceleration passage extends along a third axis, the third axis substantially aligned with the second axis.

7. The apparatus of claim 1 further comprising a second gas passage for introducing a second gas into the atomizing chamber along a fourth axis.

8. The apparatus of claim 7 wherein the fourth axis forms a non-zero acute angle with the second axis.

9. The apparatus of claim 8 wherein the first axis and fourth axis forms a substantially 90 degree angle.

10. The apparatus of claim 1 wherein the first gas passage terminates in a substantially rectangular shaped opening into the atomizing chamber.

11. The apparatus of claim 1 further comprising a rotatable support for supporting a substrate in a substantially horizontal orientation.

12. The apparatus of claim 1 further comprising a tube removably inserted within the acceleration passage.

13. The apparatus of claim 12 wherein the tube is constructed of a hydrophobic material.

14. The apparatus of claim 1 wherein the horizontal cross-sectional area of the acceleration passage is not uniform.

15. An apparatus for processing a rotating substrate comprising:
an atomizing unit having an atomizing chamber;
a first gas passage for introducing a first gas into the atomizing chamber, wherein the first gas passage terminates in an opening into the atomizing chamber, the opening having an elongated cross-sectional area;
a cleaning fluid passage for introducing a cleaning fluid into the atomizing chamber so that the cleaning fluid combines with the first gas to form a mixture within the atomizing chamber;
an acceleration unit operably connected to the atomizing unit, the acceleration unit having an acceleration passage for spraying the mixture formed in the atomizing chamber onto a substrate surface; and
a removable set screw;
wherein the first gas passage comprises a first zone and a second zone, wherein the second zone is located between the first zone and the opening, and wherein a cross-sectional area of the first zone is greater than a cross-sectional area of the second zone, and the cross-sectional area of the second zone is less than the elongated cross-sectional area of the opening; and
wherein the first gas passage extends through the set screw and further wherein the set-screw forms the second zone and the opening.

16. The apparatus of claim 15 wherein a cross-sectional area of the first gas passage prior to the opening is smaller than the elongated cross-sectional area of the opening.

17. The apparatus of claim 15 wherein the elongated cross-sectional area of the opening has a major axis and a minor axis, wherein a length of the major axis is greater than a length of the minor axis.

18. The apparatus of claim 17 wherein the elongated cross-sectional area of the opening is substantially rectangular in shape.

19. The apparatus of claim 17 wherein the elongated cross-sectional area of the opening has a slit-like shape.

20. The apparatus of claim 15 further comprising:
a second gas passage for introducing a second gas into the atomizing chamber;
wherein the first gas passage introduces the first gas into the atomizing chamber through a first side wall of the atomizing chamber and the second gas passage introduces the second gas into the atomizing chamber through a second side wall of the atomizing chamber that opposes the first side wall; and
wherein the cleaning fluid passage introduces the cleaning fluid into the atomizing chamber through a top wall of the atomizing chamber.

21. The apparatus of claim 20 wherein the first gas and the second gas are the same.

22. An apparatus for processing a rotating substrate comprising:
an atomizing unit having an atomizing chamber;

a first gas passage terminating in an opening into the atomizing chamber for introducing a first gas into the atomizing chamber along a first axis, the opening being formed within a removable set screw that forms a portion of the first gas passage; and a cleaning fluid passage for introducing a cleaning fluid into the atomizing chamber along a second axis so that the cleaning fluid combines with the first gas to form a mixture within the atomizing chamber.

* * * * *